(12) United States Patent
Lee et al.

(10) Patent No.: US 12,432,849 B2
(45) Date of Patent: Sep. 30, 2025

(54) FLIP-CHIP BONDING STRUCTURE AND CIRCUIT BOARD THEREOF

(71) Applicant: CHIPBOND TECHNOLOGY CORPORATION, Hsinchu (TW)

(72) Inventors: Chun-Te Lee, Hsinchu County (TW); Chih-Ming Peng, Taichung (TW); Pi-Yu Peng, Hsinchu County (TW); Hui-Yu Huang, Hsinchu (TW)

(73) Assignee: CHIPBOND TECHNOLOGY CORPORATION, Hsinchu (TW)

( * ) Notice: Subject to any disclaimer, the term of this patent is extended or adjusted under 35 U.S.C. 154(b) by 160 days.

(21) Appl. No.: 18/134,082

(22) Filed: Apr. 13, 2023

(65) Prior Publication Data

US 2023/0380053 A1  Nov. 23, 2023

(30) Foreign Application Priority Data

May 19, 2022 (TW) .................. 111205206

(51) Int. Cl.
  *H05K 1/02* (2006.01)
  *H01L 21/60* (2006.01)
  (Continued)

(52) U.S. Cl.
  CPC .......... *H05K 1/0266* (2013.01); *H01L 21/60* (2021.08); *H05K 1/03* (2013.01); *H05K 3/0044* (2013.01);
  (Continued)

(58) Field of Classification Search
  CPC .......... H05K 1/02; H05K 1/0266; H05K 1/11; H05K 1/111–114; H05K 1/14;
  (Continued)

(56) References Cited

U.S. PATENT DOCUMENTS 7,442,074 B2 * 10/2008 Shimoishizaka ...... H05K 3/242
                                                            439/493
7,732,933 B2 *  6/2010 Chung .................... H01L 24/17
                                                            257/772
(Continued)

FOREIGN PATENT DOCUMENTS

JP       9-82834 A    3/1997
JP    2011-155292 A   8/2011
(Continued)

OTHER PUBLICATIONS

Korean office action mailed Oct. 18, 2024 for Korean utility model application No. 20-2023-0000785, 9 pages.
(Continued)

*Primary Examiner* — Tuan T Dinh
(74) *Attorney, Agent, or Firm* — Demian K. Jackson; Jackson IPG PLLC

(57) ABSTRACT

A flip-chip bonding structure includes a chip and a circuit board, the chip is bonded to the circuit board by bumps. The circuit board includes a light-transmissive substrate, a first circuit group, a second circuit group, a boundary circuit and an identifying member. The boundary circuit is located between the first and second circuit groups and projects a boundary circuit shadow on light-transmissive substrate. The boundary circuit shadow can be recognized according to the identifying member and is provided to identify the boundary between the first and second circuit groups or identify the position of leads with the smallest pitch.

10 Claims, 5 Drawing Sheets

(51) Int. Cl.
  *H05K 1/03*  (2006.01)
  *H05K 3/00*  (2006.01)
(52) U.S. Cl.
  CPC .............. *H01L 2021/60022* (2013.01); *H05K 2201/10893* (2013.01)
(58) Field of Classification Search
  CPC . H05K 1/144–147; H05K 2201/10893; H05K 2201/10674; H05K 3/00; H05K 3/0044; H05K 3/3436; H01L 21/60; H01L 23/498; H01L 23/49811; H01L 23/552
  USPC ......... 361/760, 764, 767–782; 174/258–264; 257/685–690, 734–738
  See application file for complete search history.

(56) References Cited

U.S. PATENT DOCUMENTS

| | | | | |
|---|---|---|---|---|
| 7,804,693 | B2* | 9/2010 | Jang | .................. H01L 23/49838 |
| | | | | 361/772 |
| 11,322,437 | B2* | 5/2022 | Ma | .......................... H01L 24/17 |
| 2015/0189750 | A1* | 7/2015 | Jang | ....................... H05K 1/111 |
| | | | | 174/261 |
| 2015/0311147 | A1* | 10/2015 | Wu | ................... H01L 23/49833 |
| | | | | 257/693 |

FOREIGN PATENT DOCUMENTS

| | | |
|---|---|---|
| JP | 2017-045915 A | 3/2017 |
| KR | 10-2006-0029925 A | 4/2006 |
| KR | 10-2012-0036446 A | 4/2012 |
| KR | 10-2012-0041010 A | 4/2012 |
| KR | 10-2019-0032580 A | 3/2019 |
| KR | 10-2019-0128530 A | 11/2019 |
| KR | 10-2254166 B1 | 5/2021 |
| KR | 10-2021-0086935 A | 7/2021 |
| KR | 10-2021-0109427 A | 9/2021 |

OTHER PUBLICATIONS

Korean notice of allowance mailed Jun. 29, 2025 for Korean utility model application No. 20-2023-0000785, 3 pages.

* cited by examiner

FLIP-CHIP BONDING STRUCTURE AND CIRCUIT BOARD THEREOF

FIELD OF THE INVENTION

This invention relates to a flip-chip bonding structure and its circuit board, the boundary between two different circuit groups or the position of the leads with the smallest pitch can be recognized quickly after bonding a chip to a circuit board.

BACKGROUND OF THE INVENTION

Conventional chip is smaller and smaller in size, and bump pitch reduction and variation are required on the conventional chip. For this reason, lead pitch reduction and variation are also necessary for a circuit board which is boned with the chip. If lead pitches on the circuit board are different, the position with lead pitch variation and/or the position where the leads with the smallest pitch are located cannot be inspected after bonding bumps of the chip to leads of the circuit board. Thus, it is not easy to view whether the bumps are bonded to the leads correctly.

SUMMARY

One object of the present invention is to provide a flip-chip bonding structure, people can quickly find the boundary between a first circuit group and a second circuit group or the position where the leads with the smallest pitch are located.

A flip-chip bonding structure of the present invention includes a chip and a circuit board, the chip includes first bumps and second bumps, the circuit board includes a light-transmissive substrate, a first circuit group, a second circuit group, a boundary circuit and an identifying member. The light-transmissive substrate has a first surface and a second surface opposite to the first surface. The first circuit group, the second circuit group and the boundary circuit are arranged on the first surface of the light-transmissive substrate, and the boundary circuit is located between the first and second circuit groups. The first circuit group includes first leads, and there is a first gap between the adjacent first leads. Each of the first leads includes a first bonding portion and projects a first lead shadow on the second surface of the light-transmissive substrate. Each of the first bumps is bonded to the first bonding portion of one of the first leads and projects a first bump shadow on the second surface of the light-transmissive substrate. The second circuit group includes second leads, there is a second gap between the adjacent second leads, and the second gap is not equal to the first gap. Each of the second leads includes a second bonding portion and projects a second lead shadow on the second surface of the light-transmissive substrate. Each of the second bumps is bonded to the second bonding portion of one of the second leads and projects a second bump shadow on the second surface of the light-transmissive substrate. The boundary circuit projects a boundary circuit shadow on the second surface of the light-transmissive substrate. The identifying member is located on the second surface of the light-transmissive substrate, and the boundary circuit shadow and the identifying member are passed through by a vertical imaginary line.

A circuit board of a flip-chip bonding structure of the present invention includes a light-transmissive substrate, a first circuit group, a second circuit group, a boundary circuit and an identifying member. The light-transmissive substrate has a first surface and a second surface opposite to the first surface, the first circuit group, the second circuit group and the boundary circuit are arranged on the first surface of the light-transmissive substrate, and the boundary circuit is located between the first and second circuit groups. The first circuit group includes first leads, and there is a first gap between the adjacent first leads. Each of the first leads includes a first bonding portion and projects a first lead shadow on the second surface of the light-transmissive substrate. The second circuit group includes second leads, there is a second gap between the adjacent second leads, and the second gap is not equal to the first gap. Each of the second leads includes a second bonding portion and projects a second lead shadow on the second surface of the light-transmissive substrate. The boundary circuit projects a boundary circuit shadow on the second surface of the light-transmissive substrate. The identifying member is located on the second surface of the light-transmissive substrate, and the boundary circuit shadow and the identifying member are passed through by a vertical imaginary line.

The boundary circuit shadow can be identified easily according to the identifying member shown on the second surface of the light-transmissive substrate. And according to the identifying member and the boundary circuit shadow, boundary between the first and second circuit groups and/or position of the leads with the smallest pitch can be identified quickly and correctly. Thus, it is helpful to inspect whether the first and second bumps are bonded to the first and second leads incorrectly.

DETAILED DESCRIPTION OF THE INVENTION

Figure 1:
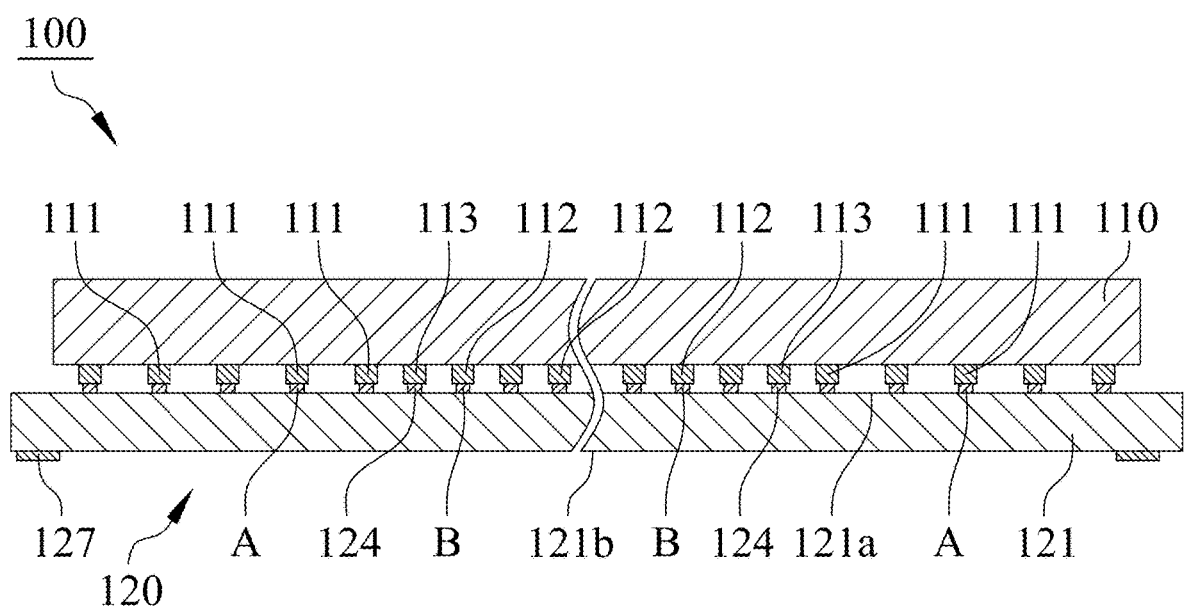
FIG. 1 is a cross-section view diagram illustrating a flip-chip binding structure in accordance with one embodiment of the present invention.
Figure 2:
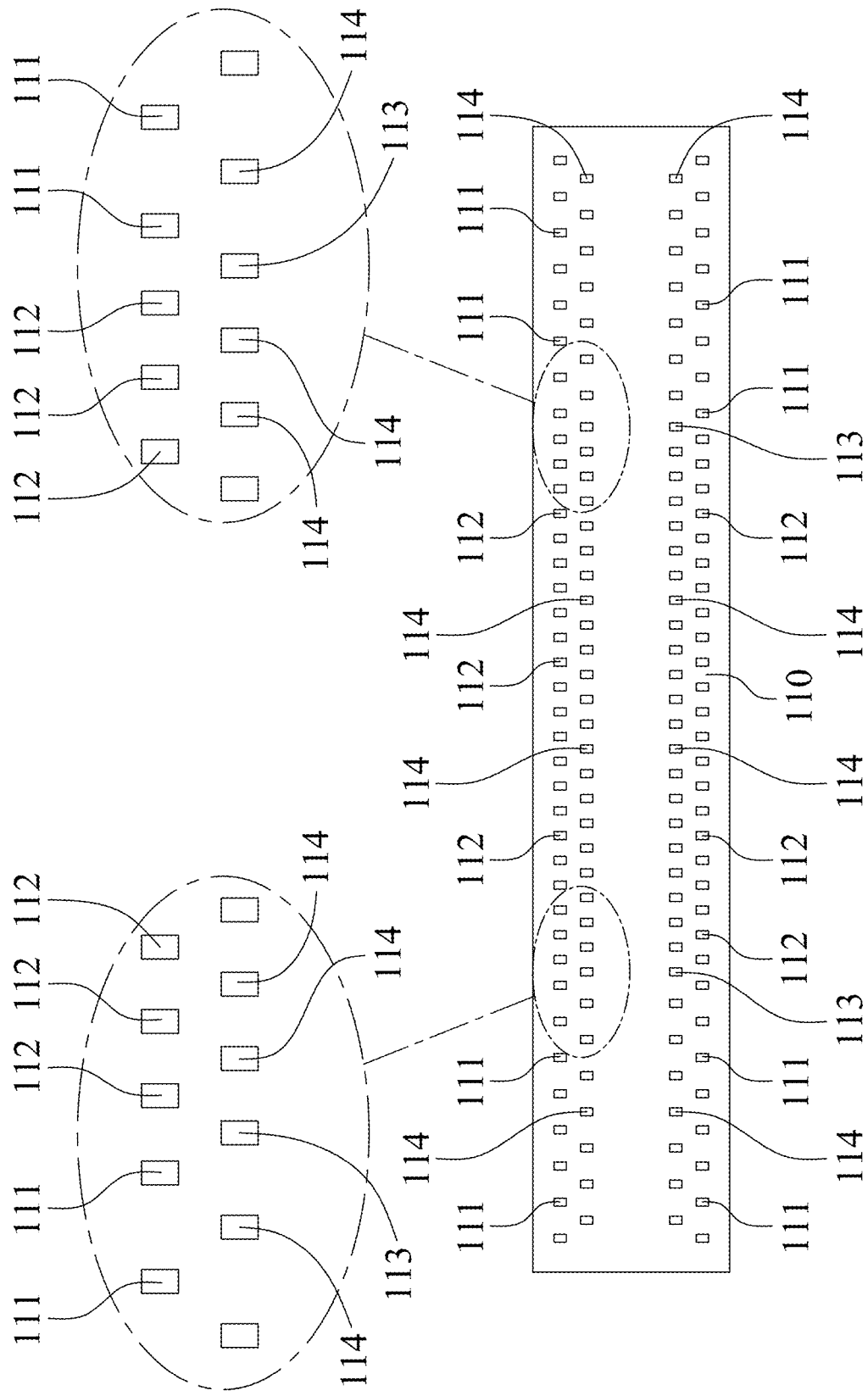
FIG. 2 is a bottom view diagram illustrating a chip of a flip-chip binding structure in accordance with one embodiment of the present invention.

A flip-chip bonding structure 100 of the present invention shown in FIGS. 1 and 2 includes a chip 110 and a circuit board 120 which is bonded to the circuit board 110 by a plurality of first bumps 111 and second bumps 112.

Figure 3:
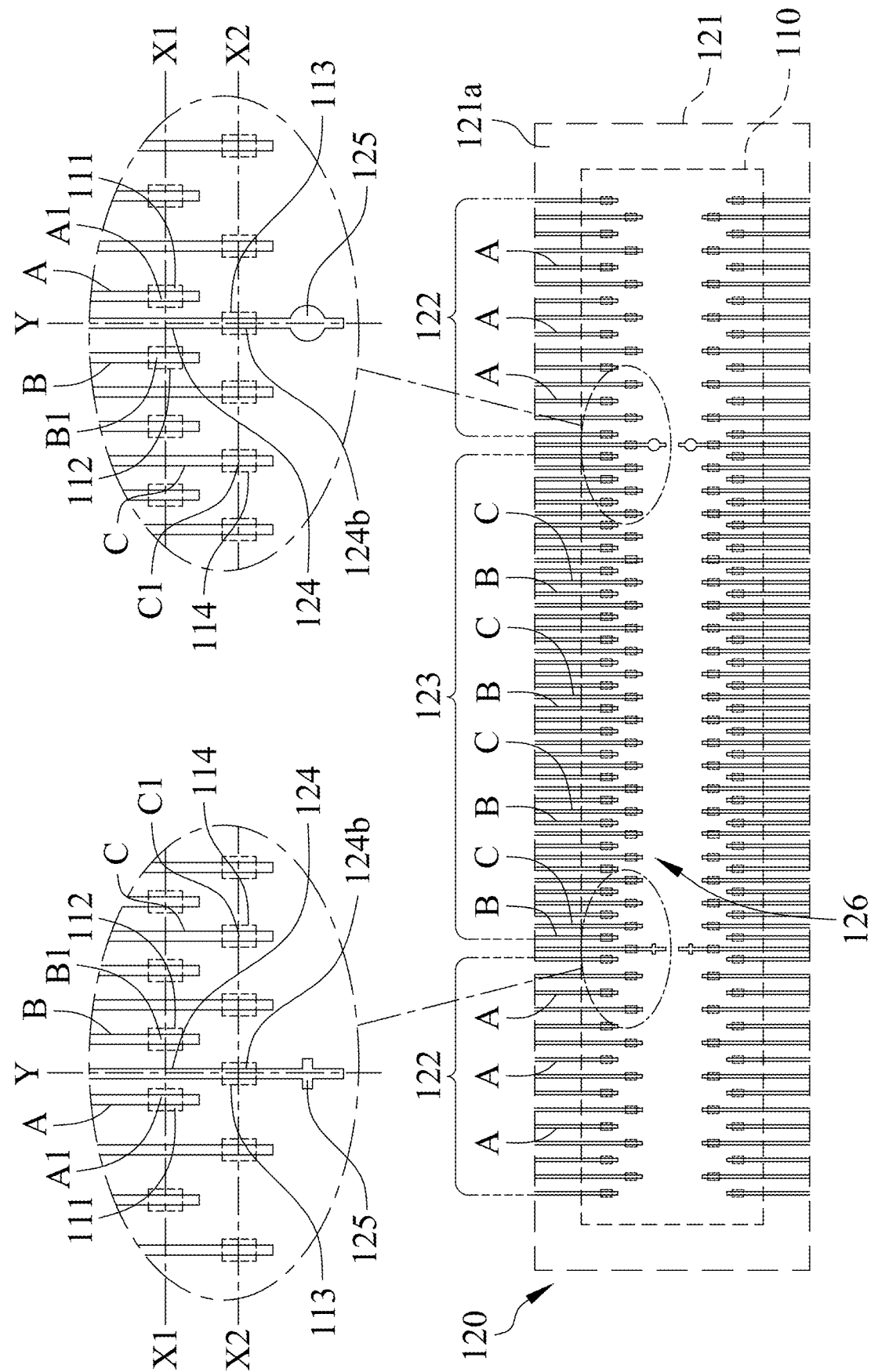
FIG. 3 is a bottom view diagram illustrating a flip-chip binding structure in accordance with one embodiment of the present invention.
Figure 4:
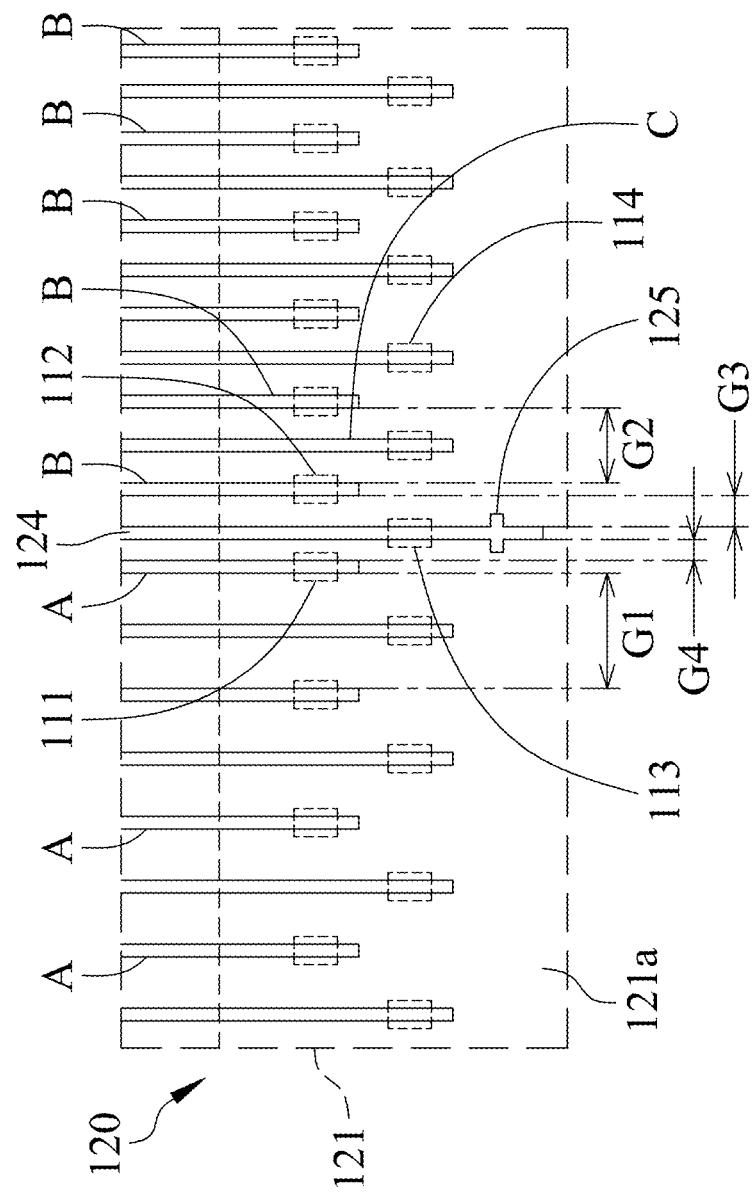
FIG. 4 is a partial enlarged diagram of FIG. 3.
Figure 5:
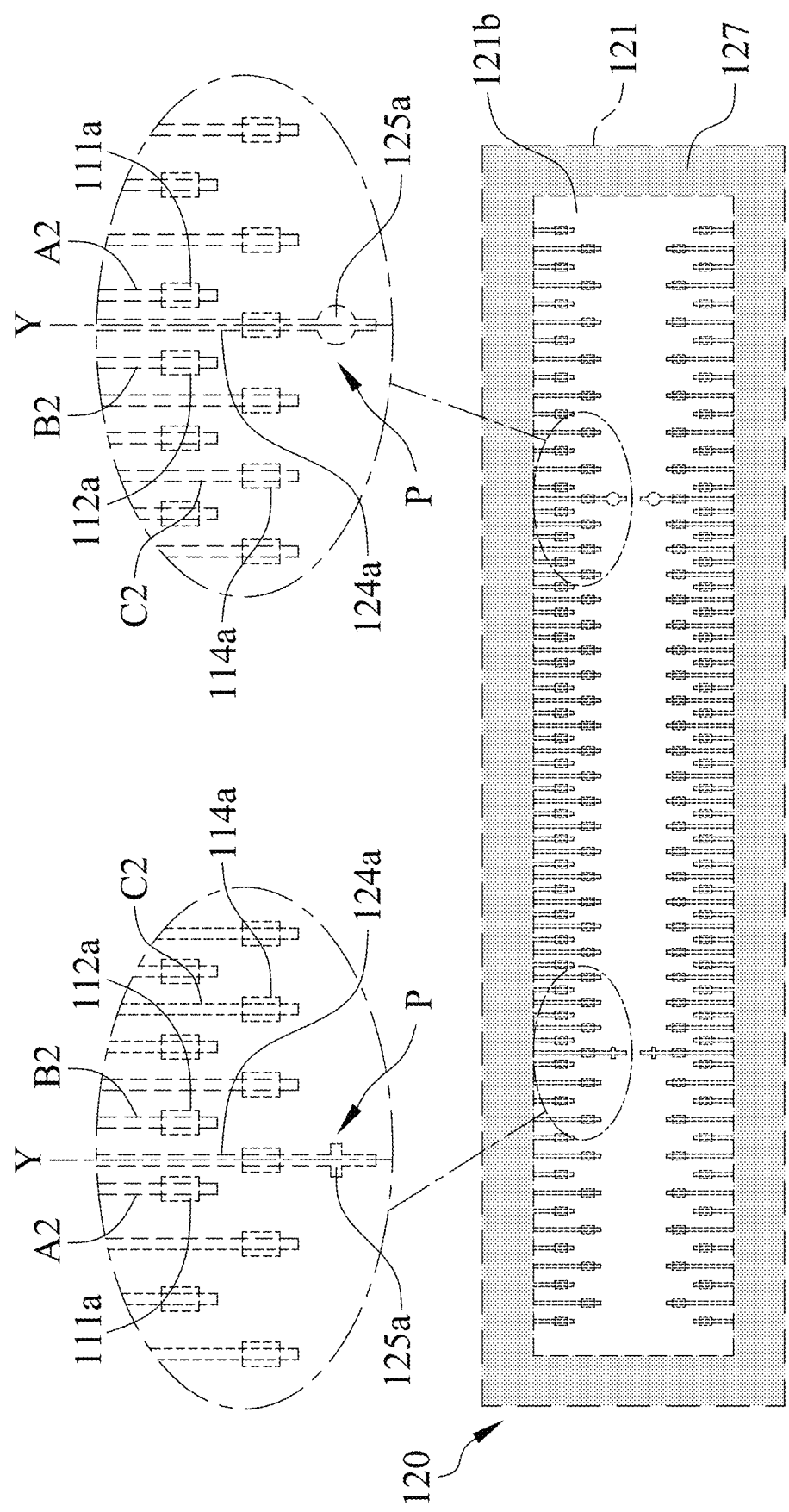
FIG. 5 is a bottom view diagram illustrating a flip-chip binding structure in accordance with one embodiment of the present invention.

With reference to FIGS. 1, 3, 4 and 5, the circuit board 120 includes a light-transmissive substrate 121, a first circuit group 122, a second circuit group 123, a boundary circuit 124 and an identifying element 125a. The first circuit group 122, the second circuit group 123 and the boundary circuit 124 are arranged on a first surface 121a of the light-transmissive substrate 121. The boundary circuit 124 is located between the first circuit group 122 and the second circuit group 123 and it may a dummy lead. With reference to FIG. 5, the boundary circuit 124 projects a boundary circuit shadow 124a on a second surface 121b of the light-transmissive substrate 121, and the identifying member 125a is located on the second surface 121b of the light-transmissive substrate 121. The second surface 121b of the light-transmissive substrate 121 is opposite to the first surface 121a.

With reference to FIGS. 3 to 5, the circuit board 120 further includes a boundary mark 125 arranged on the first surface 121a of the light-transmissive substrate 121. The boundary mark 125 may be a mark made of metal material or photoresist material, or it may be a recess or through hole formed on the first surface 121a of the light-transmissive substrate 121. While the boundary mark 125 is a metallic mark, a photoresist mark or a recess, the shadow which the boundary mark 125 projects on the second surface 121b is the identifying member 125a on the second surface 121b of the light-transmissive substrate 121. Preferably, the first circuit group 122, the second circuit group 123, the boundary circuit 124 and the boundary mark 125 are made of the same metal material. While the boundary mark 125 is a through hole on the light-transmissive substrate 121, an opening of the through hole visible on the second surface 121b is the identifying member 125a.

With reference to FIGS. 3 to 5, a vertical imaginary line Y passes through the boundary circuit shadow 124a and the identifying member 125a on the second surface 121b of the light-transmissive substrate 121. The identifying member 125a is provided to mark the boundary circuit shadow 124a and help people to identify where the boundary circuit shadow 124a is. Because of the boundary circuit shadow 124a and the identifying member 125a, people can quickly fine the boundary between the first circuit group 122 and the second circuit group 123. Preferably, a cross pattern P is formed by the boundary circuit shadow 124a and the identifying member 125a, and in this embodiment, the boundary circuit 124 and the boundary mark 125 project the cross-pattern P on the second surface 121b of the light-transmissive substrate 121.

With reference to FIGS. 1, 3, 4 and 5, the first circuit group 122 includes a plurality of first leads A each including a first bonding portion A1, and there is a first gap G1 between the adjacent first leads A. Each of the first bumps 111 of the chip 110 is boned to the first bonding portion A1 of one of the first leads A, respectively. With reference to FIGS. 3 and 5, each of the first leads A projects a first lead shadow A2 on the second surface 121b of the light-transmissive substrate 121, and each of the first bumps 111 projects a first bump shadow 111a on the second surface 121b of the light-transmissive substrate 121.

With reference to FIGS. 1, 3, 4 and 5, the second circuit group 123 includes a plurality of second leads B, each of the second leads B includes a second bonding portion B1, there is a second gap G2 between the adjacent second leads B, and the distance value of the second gap G2 is not equal to the distance value of the first gap G1. Each of the second bumps 112 of the chip 110 is boned to the second bonding portion B1 of one of the second leads B, respectively. With reference to FIGS. 3 and 5, each of the second leads B projects a second lead shadow B2 on the second surface 121b of the light-transmissive substrate 121, and each of the second bumps 112 projects a second bump shadow 112a on the second surface 121b of the light-transmissive substrate 121.

With reference to FIGS. 1 to 4, the chip 110 further includes a third bump 113 in this embodiment, the third bump 113 is bonded to a bonding portion 124b of the boundary circuit 124. A first horizontal imaginary line X1 which is perpendicular to the vertical imaginary line Y passes through the first bonding portion A1 of each of the first leads A and the second bonding portion B1 of each of the second leads B. A second horizontal imaginary line X2, which is perpendicular to the vertical imaginary line Y and parallel to the first horizontal imaginary line X1, passes through the bonding portion 124b of the boundary circuit 124.

With reference to FIGS. 2 to 4, the circuit board 120 of this embodiment further includes at least one third circuit group 126. The third circuit group 126 is located on the first surface 121a of the light-transmissive substrate 121 and includes a plurality of third leads C, each of the third leads C is located between the adjacent second leads B and includes a third bonding portion C1. The chip 110 further includes a plurality of fourth bumps 114 in this embodiment, each of the fourth bumps 114 is bonded the third bonding portion C1 of one of the third leads C, respectively. With reference to FIGS. 3 and 5, each of the third leads C projects a third lead shadow C2 on the second surface 121b of the light-transmissive substrate 121, and each of the fourth bumps 114 projects a fourth bump shadow 114a on the second surface 121b of the light-transmissive substrate 121. In this embodiment, the second horizontal imaginary line X2 passes through the bonding portion 124b of the boundary circuit 124 and the third bonding portion C1 of each of the third leads C.

With reference to FIGS. 3 and 4, in this embodiment, the boundary circuit 124 is located between one of the first leads A of the first circuit group 122 and one of the second leads B of the second circuit group 123. The second gap G2 between the adjacent second leads B is less than the first gap G1 between the adjacent first leads A. There is a third gap G3 between the boundary circuit 124 and the second lead B which is closest to the boundary circuit 124, and there is a fourth gap G4 between the boundary circuit 124 and the first lead A which is closest to the boundary circuit 124. The third gap G3 and the fourth gap G4 are less than second gap G2 between the adjacent second leads B, and preferably, the fourth gap G4 is less than or equal to the third gap G3.

With reference to FIGS. 3 and 5, after bonding the first bumps 111, the second bumps 112 and the third bump 113 of the chip 110 to the circuit board 120, people can recognize the boundary circuit shadow 124a according to the identifying member 125a, and people can quickly find the boundary between the first lead shadow A2 and the second lead shadow B2 according to the identifying member 125a and the boundary circuit shadow 124a to know the position with lead pitch variation. In addition, the position where the leads with the smallest pitch are located can be found according to the identifying member 125a and the boundary circuit shadow 124a. The first lead shadow A2 and the first bump shadow 111a are provided to inspect whether the first bumps 111 are incorrectly bonded to the first leads, and the second lead shadow B2 and the second bump shadow 112a are provided to inspect whether the second bumps 112 are bonded to the second leads B incorrectly.

With reference to FIGS. 1 and 5, preferably, the circuit board 120 further includes a supportive layer 127 which is located on the second surface 121b of the light-transmissive substrate 121 and may be a functional patterned metal layer. The boundary circuit shadow 124a, the second lead shadow B2 and the second bump shadow 112a close to the boundary circuit shadow 124a are not covered by the supportive layer 127. The supportive layer 127 can be electrically connected to the first circuit group 122, the second circuit group 123 and/or the boundary circuit 124 through the vias (not shown) located in the light-transmissive substrate 121. Moreover, the supportive layer 127 can enhance compressive strength and anti-warpage property of the light-transmissive substrate 121.

While this invention has been particularly illustrated and described in detail with respect to the preferred embodiments thereof, it will be clearly understood by those skilled in the art that is not limited to the specific features shown and described and various modified and changed in form and details may be made without departing from the scope of the claims.

What is claimed is:

1. A flip-chip bonding structure comprising:
    a chip including a plurality of first bumps and a plurality of second bumps; and
    a circuit board including:
        a light-transmissive substrate including a first surface and a second surface;
        a first circuit group disposed on the first surface and including a plurality of first leads, each of the plurality of first leads includes a first bonding portion and projects a first lead shadow on the second surface, there is a first gap between the adjacent first leads, each of the plurality of first bumps is configured to be bonded to the first bonding portion of one of the plurality of first leads and projects a first bump shadow on the second surface;
        a second circuit group disposed on the first surface and including a plurality of second leads, each of the plurality of second leads includes a second bonding portion and projects a second lead shadow on the second surface, there is a second gap between the adjacent second leads, the second gap is not equal to the first gap, each of the plurality of second bumps is configured to be bonded to the second bonding portion of one of the plurality of second leads and projects a second bump shadow on the second surface;
        a boundary circuit disposed on the first surface and located between the first and second circuit groups, the boundary circuit projects a boundary circuit shadow on the second surface; and
        an identifying member located on the second surface, wherein the boundary circuit shadow and the identifying member are configured to be passed through by a vertical imaginary line.

2. The flip-chip bonding structure in accordance with claim 1, wherein the circuit board further includes a boundary mark which is disposed on the first surface of the light-transmissive substrate, the boundary mark is a mark made of metal material, a mark made of photoresist material or a recess located on the first surface of the light-transmissive substrate, the identifying member is a shadow of the boundary mark which is projected on the second surface of the light-transmissive substrate.

3. The flip-chip bonding structure in accordance with claim 1, wherein the circuit board further includes a boundary mark which is disposed on the first surface of the light-transmissive substrate, the boundary mark is a through hole, the identifying member is an opening of the through hole, and the opening is exposed on the second surface of the light-transmissive substrate.

4. The flip-chip bonding structure in accordance with claim 1, wherein a cross-pattern is formed on the second surface of the light-transmissive substrate by the boundary circuit shadow and the identifying member.

5. The flip-chip bonding structure in accordance with claim 2, wherein a cross-pattern is formed on the second surface of the light-transmissive substrate by the boundary circuit shadow of the boundary circuit and the identifying member of the boundary mark.

6. The flip-chip bonding structure in accordance with claim 1, wherein the circuit board further includes a boundary mark which is disposed on the first surface of the light-transmissive substrate, the identifying member is a shadow of the boundary mark which is projected on the second surface of the light-transmissive substrate, the boundary circuit and the boundary mark are made of the same material.

7. The flip-chip bonding structure in accordance with claim 1, wherein the chip further includes a third bump which is configured to be bonded to a bonding portion of the boundary circuit, the first bonding portion of each of the plurality of first leads and the second bonding portion of each of the plurality of second leads are configured to be passed through by a first horizontal imaginary line which is perpendicular to the vertical imaginary line, the bonding portion of the boundary circuit is configured to be passed through by a second horizontal imaginary line which is perpendicular to the vertical imaginary line and parallel to the first horizontal imaginary line.

8. The flip-chip bonding structure in accordance with claim 1, wherein the second gap is less than the first gap, there is a third gap between the boundary circuit and the second lead which is adjacent to the boundary circuit, the third gap is less than the second gap.

9. The flip-chip bonding structure in accordance with claim 8, wherein there is a fourth gap between the boundary circuit and the first lead which is adjacent to the boundary circuit, the fourth gap is less than the second gap, and the fourth gap is less than or equal to the third gap.

10. The flip-chip bonding structure in accordance with claim 8, wherein the circuit board further includes a supportive layer which is disposed on the second surface of the light-transmissive substrate, the boundary circuit shadow and the second lead shadow adjacent to the boundary circuit shadow are not covered by the supportive layer.

* * * * *